United States Patent [19]

Nakazawa et al.

[11] Patent Number: 4,771,431
[45] Date of Patent: Sep. 13, 1988

[54] SEMICONDUCTOR LASER DRIVE

[75] Inventors: Toshihiko Nakazawa, Hachioji; Takashi Murahashi, Hino; Yoshiyuki Ichihara, Chofu; Toshihiro Takesue, Musashino, all of Japan

[73] Assignee: Konishiroku Photo Industry Co., Ltd., Tokyo, Japan

[21] Appl. No.: 901,185

[22] Filed: Aug. 27, 1986

[30] Foreign Application Priority Data

Aug. 30, 1985 [JP] Japan ................................ 60-189385
Aug. 30, 1985 [JP] Japan ................................ 60-189386

[51] Int. Cl.[4] ........................... H01S 3/00; H01S 3/13
[52] U.S. Cl. ......................................... 372/38; 372/29; 372/32; 372/33
[58] Field of Search ........................ 372/38, 32, 29, 26, 372/34, 33

[56] References Cited

U.S. PATENT DOCUMENTS 4,237,427 12/1980 Holland .................. 372/38

FOREIGN PATENT DOCUMENTS 60-21585 2/1985 Japan ................... 372/38

Primary Examiner—William L. Sikes
Assistant Examiner—Georgia Y. Epps
Attorney, Agent, or Firm—Jordan B. Bierman

[57] ABSTRACT

A semiconductor laser driver is designed to detect a semiconductor laser output and control a drive voltage or current of a semiconductor laser so as to set a detected laser output to be a predetermined constant laser output. The laser driver includes an integrator for integrating the detected laser output, thereby utilizing an integrated signal as a semiconductor laser drive signal. The integrator integrates the difference between a voltage corresponding to the detected laser output and a reference voltage corresponding to the predetermined constant laser output.

6 Claims, 1 Drawing Sheet

SEMICONDUCTOR LASER DRIVE

BACKGROUND OF THE INVENTION

1. Field of the Invention

The present invention relates to a driver for driving a semiconductor laser such as a laser diode.

2. Description of the Prior Art

Laser output vs. drive current characteristics of semiconductor lasers greatly vary according to their operating temperatures. More specifically, in order to obtain an identical laser output, a larger current is required at a high temperature.

In a conventional laser printer using a semiconductor laser as a laser source, if a laser output is not constant in the write mode, the image quality is degraded, thus posing problems in quality of recorded images.

For this reason, a conventional semiconductor laser driver is proposed wherein a laser output can be kept constant regardless of operating temperatures. This driver is called an APC (Automatic Power Control) circuit.

An example of the conventional semiconductor laser driver is constituted by a combination of an APC circuit for driving a semiconductor laser at a constant voltage and a semiconductor laser modulator.

In order to achieve temperature compensation in the constant voltage drive type APC circuit, a drive voltage for the semiconductor laser must vary according to an ambient temperature to keep the laser output constant. For this purpose, for example, an ambient temperature is detected and converted into an electrical signal and the drive voltage is then controlled in response to the cnverted electrical signal.

According to this technique, the temperature characteristics of the semiconductor laser must be checked in advance, and the corresponding control voltage must be generated. However, the characteristics of the individual semiconductor lasers vary and also change over time. Therefore, it is difficult to perform accurate temperature compensation.

SUMMARY OF THE INVENTION

It is a first object of the present invention to keep a semiconductor laser output constant regardless of semiconductor laser characteristic variations caused by changes in ambient temperature and deteriorations over time without measuring the temperature characteristics or the like of the semiconductor laser.

In order to achieve the first object of the present invention, there is provided a semiconductor laser driver for detecting a semiconductor laser output and controlling a drive voltage or current of a semiconductor laser so as to set a detected laser output to be a predetermined constant laser output, comprising an integrator for integrating the detected laser output, thereby utilizing an integrated signal as a semiconductor laser drive signal.

It is a second object of the present invention to provide a semiconductor laser driver including an integrator with a sample/hold function, wherein an overvoltage or overcurrent is not supplied to a semiconductor laser, thereby preventing damage and degradation of the semiconductor laser.

In order to achieve the second object of the present invention, there is provided a semiconductor laser driver wherein at least two reference voltages for setting a semiconductor laser output are used.

BRIEF DESCRIPTION OF THE DRAWINGS

The above and other objects, features, and advantages of the semiconductor laser driver will be readily understood from the following description with reference to the accompanying drawings, in which.

DETAILED DESCRIPTION OF THE PREFERRED EMBODIMENTS

Figure 1:
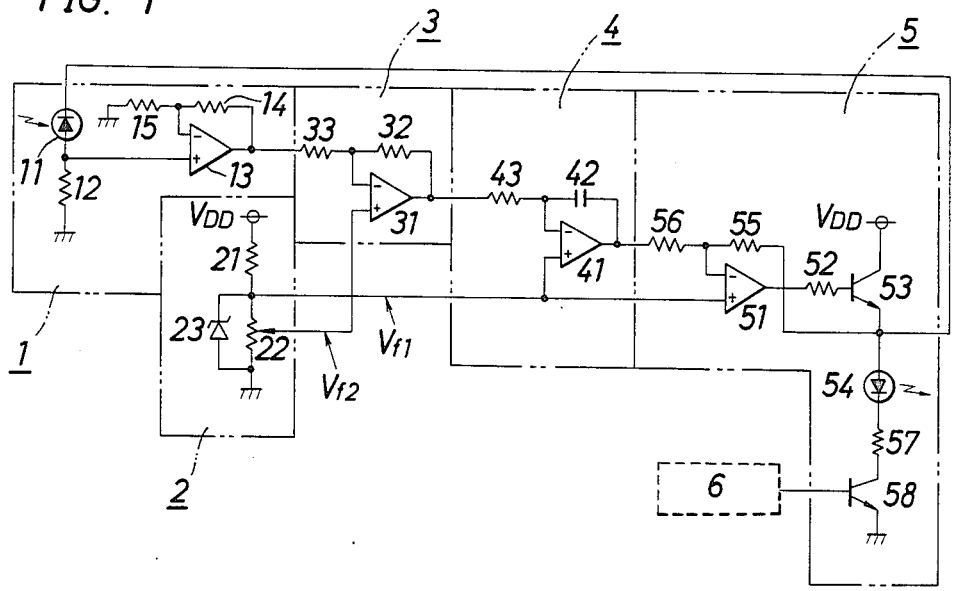
FIG. 1 is a circuit diagram of a driver for driving a laser diode as one type of semiconductor lasers according to an embodiment of the present invention.

Preferred embodiments of the present invention will be described in detail hereinafter. FIG. 1 is a circuit diagram of a driver for driving a laser diode as one type of semiconductor lasers for laser printers according to an embodiment of the present invention.

Referring to FIG. 1, reference numeral 1 denotes a laser output detector for detecting an output from a laser diode. In the laser output detector 1, a common node between a photodiode 11 and a load resistor 12 is connected to the noninverting input terminal of an operational amplifier 13. A voltage obtained by dividing an output voltage from the operational amplifier 13 by resistors 14 and 15 is fed back to the inverting input terminal thereof. In the laser output detector 1, when a laser output received by the photodiode 11 is increased, a voltage input to the noninverting input terminal of the operational amplifier 13 is increased accordingly, thereby outputting a higher voltage.

Reference numeral 2 denotes a reference voltage generator which includes a series circuit of a fixed resistor 21 and a variable resistor 22. A voltage across the variable resistor 22 is kept constant by a Zener diode 23. There are two types of reference voltages, i.e., a voltage Vf1 at the Zener diode 23, and a voltage Vf2 from the variable resistor 22.

Reference numeral 3 denotes a differential amplifier which comprises an operational amplifier 31 and resistors 32 and 33 for determining a feedback level of the operational amplifier 31. The differential amplifier 3 compares the output voltage from the laser output detector 1 with the voltage from the variable resistor 22 in the reference voltage generator 2 and outputs a comparison voltage. More specifically, the comparison voltage is decreased when the output voltage from the laser output detector is increased. If the resistance of the variable resistor 22 in the reference voltage generator 2 is adusted, the voltage Vf2 is changed to adjust the comparison reference value. Therefore, variations between the components can be adjusted.

Reference numeral 4 denotes an integrator as the characteristic feature of the present invention. The integrator 4 comprises an operational amplifier 41, a capacitor 42 connected between the output terminal and the inverting input terminal of the operational amplifier 41, and a resistor 43 connected to the inverting input terminal of the operational amplifier 41. An output voltage from the differential amplifier 3 is input to the resistor 43, and the reference voltage Vf1 is applied to the noninverting input terminal of the operational amplifer 41.

The integrator 4 integrates a difference between the reference voltage Vf1 and the output voltage from the differential amplifier as a function of time. If these voltages coincide with each other, the integrator 4 stops the integration and an output voltage from the integrator 4 becomes fixed. In other words, the integrator 4 integrates the detected laser output signal and outputs an integrated signal as a laser diode drive control signal.

Reference numeral 5 denotes an output circuit which includes an operational amplifier 51, an output transistor 53, a laser diode 54, resistors 55 and 56, a load resistor 57, and a modulating transistor 58. The noninverting input terminal of the operational amplifier 51 receives the reference voltage Vf1 and the inverting input terminal thereof receives the output voltage from the integrator 4. The output transistor 53 is controlled in response to the output voltage from the operational amplifier 51 through a resistor 52. The laser diode 54 is powered by the transistor 53. The resistors 55 and 56 feed back a signal representing the power level of the laser diode 54 to the operational amplifier 51. The modulating transistor 58 modulates (ON/OFF) the laser diode 54 by using the load resistor 57 for the laser diode 54 and the modulated output voltage from the modulator 6.

The laser diode 54 is optically coupled to the photodiode 11 such that part of the laser beam from the diode 54 is incident on the photodiode 11. A power souce for the photodiode 11 is an output voltage from the output transistor 53.

The laser output from the laser diode 54 is detected by the photodiode 11 and converted into an electrical signal. The electrical signal is amplified by the operational amplifier 13. An output from the operational amplifier 13 is compared with the reference voltage Vf2 by the differential amplifier 3 so that a difference therebetween is calculated. A difference voltage is integrated by the integrator 4. An integrated signal is supplied to the laser diode 54, and thus the laser diode 54 is turned on. The laser output is fed back to the laser output detector 1.

In the standby mode (write wait mode) of the laser printer, the integrating capacitor 42 is precharged at a suitable level. An output voltage from the integrating capacitor 42 is high enough to turn on the laser diode 54. In this case, the modulating transistor 58 is kept off.

Thereafter, when the transistor 58 and therefore the laser diode 54 are turned on, a laser output is detected by the photodiode 11. An output voltage at the laser output detector 1 is increased, and the output voltage from the differential amplifier 3 is decreased. As a result, an output from the integrator 4 and hence the laser output are changed.

The above operation continues until the output voltage from the differential amplifier 3 coincides with the voltage input to the noninverting input terminal of the operational amplifier 41 in the integrator 4. When a coincidence is established, the laser output is controlled to be constant.

In this case, if the temperature characteristics of the circuit components excluding the laser diode 54 are neglected, the integrator 4 continues its operation until the laser output reaches the value predetermined by the reference voltage generator 2 regardless of temperature changes. Therefore, the laser output can be always kept constant without being influenced by temperature changes.

In the circuit arrangement of the above embodiment, if the integrator 4 is omitted, the laser detection signal from the photodiode 11 is proportional to the voltage applied to the output circuit 5. In this case, the laser output from the laser diode 54 cannot often be controlled to reach the target value corresponding to the reference voltage Vf1. Even if the laser output from the laser diode 54 is kept unchanged, a larger current is required for a higher temperature of the diode 54. In a loop without the integrator 4, fine adjustment cannot be performed. This problem can be solved by using the integrator 4. This also applies to laser output variations over time of the laser diode 54.

Figure 2:
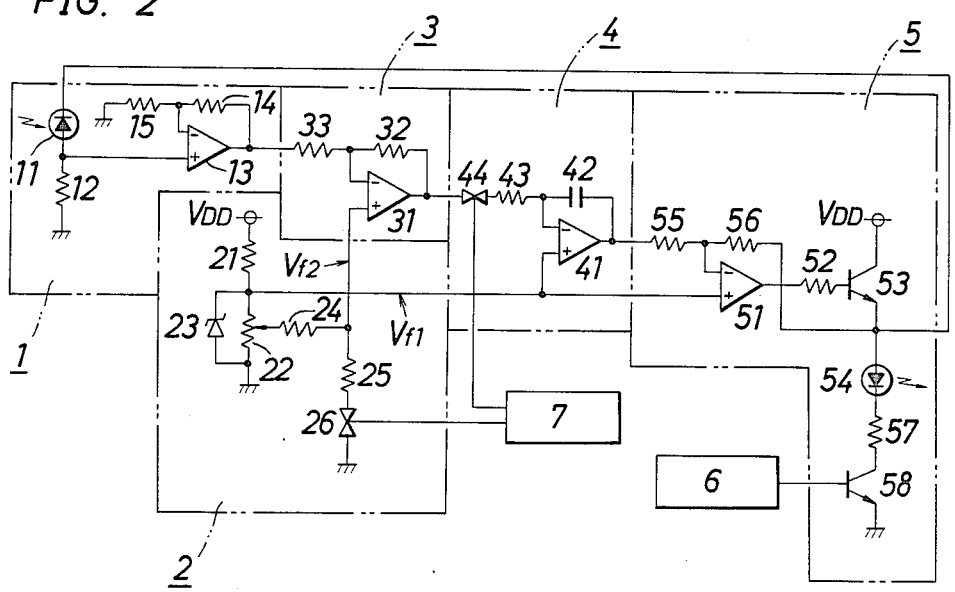
FIG. 2 is a circuit diagram of a laser diode driver according to another embodiment of the present invention.

FIG. 2 shows a laser diode driver according to another embodiment of the present invention.

The circuit arrangement of this embodiment is substantially the same as that of FIG. 1 except for the following points.

A reference voltage generator 2 includes a resistor 24 for extracting a voltage from a sliding terminal of a variable resistor 22, a resistor 25 cooperating with the resistor 24 to divide the extracted voltage, and an analog switch 26 for turning on/off the resistor 25, in addition to a fixed resistor 21, the variable resistor 22, and a Zener diode 23. There are two types of reference voltages, i.e., a voltage Vf1 from the Zener diode 23 and a voltage Vf2 from the common node between the resistors 24 and 25. The analog switch 26 is turned on/off in response to a timing signal from a timing control circuit 7.

The reference voltage Vf2 from the reference voltage generator 2 has two levels upon on/off operation of the analog switch 26. If the analog switch 26 is turned off, the reference voltage Vf2 is set at high level set by the sliding terminal of the variable resistor 22, i.e., a write voltage potential. However, if the analog switch 26 is turned on, the reference voltage Vf2 is set at low level obtained by dividing the voltage at the sliding terminal by the resistors 24 and 25. The low level voltage is set to generate a zero laser output.

An integrator 4 includes an analog switch 44 for turning on/off the input voltage, in addition to an operational amplifier 41, a capacitor 42, and a resistor 43. The ON/OFF timings of the analog switch 44 are controlled by the timing control circuit 7.

In this embodiment, when the analog switch 44 is turned off, the operation of the integrator 4 is forcibly stopped so that the corresponding voltage across the integrator capacitor 42 is kept unchanged. In other words, the analog switch 44 controls the sample/hold timings.

Figure 3:
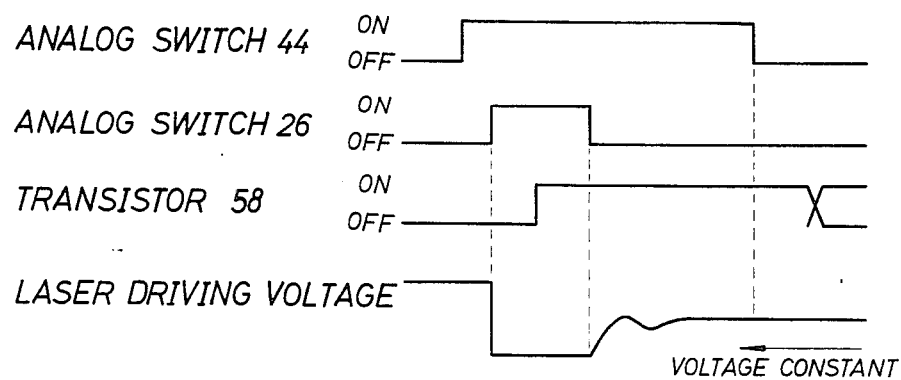
FIG. 3 is a timing chart for explaining the operation of the laser diode driver in FIG. 1.

If the laser diode 54 is kept off for a long period of time, the integrator 4 continues to operate so as to increase the drive voltage until the drive voltage reaches the maximum one. This operation condition is detected by a separate detecting means (not shown). If the drive voltage is detected as an excessive one, the analog switch 26 is temporarily turned on by the timing control circuit 7 before the laser diode 54 is turned on so that the reference voltage Vf2 goes low. The integrating capacitor 42 is discharged (or charged) to temporarily set the drive voltage for the laser diode 54 to be zero. When the analog switch 26 is turned off again to set the reference voltage Vf2 at high level, the drive voltage is gradually increased. The above operation is repeated until the laser diode 54 is turned on. FIG. 3 is a timing chart for explaining the operation of the circuit in FIG. 2. Therefore, the overvoltage or overcurrent is not supplied to the laser diode 54.

What we claim is:

1. A semiconductor laser driver comprising:
a semiconductor laser driven by a drive current and providing a light output;
a detecting circuit for detecting the output of said semiconductor laser and providing a voltage signal corresponding thereto;
a reference signal generating circuit for generating a reference voltage signal corresponding to a predetermined constant output value which is to be output by said semiconductor laser;
a comparing circuit receiving said voltage signal from said detecting circuit and said reference voltage signal from said reference signal generating circuit and providing a comparison voltage output based thereon;
an integrator circuit, including an operational amplifier receiving said comparison voltage output from said comparing circuit as one input and said reference voltage signal as another input, for integrating the difference between the comparison voltage and the reference voltage as a function of time and providing an integrated voltage signal as a laser drive control signal; and
an output circuit, including a transistor receiving said laser drive control signal from said integrator circuit, for providing the drive current to said semiconductor laser in correspondence with said laser drive control signal.

2. A driver according to claim 1, wherein the reference voltage for setting the laser output from said semiconductor laser includes at least two reference voltages.

3. A driver according to claim 2, wherein said at least two reference voltages are selectively switched in response to a control signal from a separate timing circuit.

4. A driver according to claim 2, further comprising a sample/hold function for keeping the drive current for said semiconductor laser for a predetermined period of time.

5. A semiconductor laser driver according to claim 1 wherein said comparing circuit is a differential circuit.

6. A semiconductor laser driver according to claim 1 further comprising a timing circuit for switching said reference signal.

* * * * *